United States Patent
Song (10) Patent No.: US 7,733,734 B2
(45) Date of Patent: Jun. 8, 2010

(54) SEMICONDUCTOR MEMORY DEVICE WITH CONTROL BLOCK SHARING ROW DECODERS

(75) Inventor: Woo-Seok Song, Ichon (KR)

(73) Assignee: Hynix Semiconductor Inc. (KR)

( * ) Notice: Subject to any disclaimer, the term of this patent is extended or adjusted under 35 U.S.C. 154(b) by 138 days.

(21) Appl. No.: 12/047,827

(22) Filed: Mar. 13, 2008

(65) Prior Publication Data

US 2009/0073797 A1 Mar. 19, 2009

(30) Foreign Application Priority Data

Sep. 13, 2007 (KR) .................. 10-2007-0092873

(51) Int. Cl.
*G11C 8/00* (2006.01)
(52) U.S. Cl. .................. 365/230.03; 365/189.04; 365/189.05; 365/230.06
(58) Field of Classification Search ........... 365/230.03, 365/230.06, 189.04, 203, 189.05
See application file for complete search history.

(56) References Cited

U.S. PATENT DOCUMENTS

| 5,708,623 | A | 1/1998 | Choi | |
|---|---|---|---|---|
| 6,078,542 | A * | 6/2000 | Tomishima | 365/230.03 |
| 6,704,240 | B2 | 3/2004 | Kang | |
| 6,765,842 | B2 * | 7/2004 | Kim | 365/230.03 |
| 7,079,417 | B2 * | 7/2006 | Nam et al. | 365/185.11 |
| 7,577,025 | B2 * | 8/2009 | Kim et al. | 365/184 |
| 2005/0141323 | A1 | 6/2005 | Shim | |

FOREIGN PATENT DOCUMENTS

| JP | 09-219091 | 8/1997 |
|---|---|---|
| KR | 1020070057336 A | 6/2007 |

* cited by examiner

*Primary Examiner*—Pho M. Luu
(74) *Attorney, Agent, or Firm*—Baker & McKenzie LLP (57) ABSTRACT

A semiconductor memory device comprises a plurality of banks including a plurality of mat rows, respectively, wherein the mat row includes a plurality of mats disposed in a same row, row decoder groups disposed between the banks and including row decoders that correspond to the mat rows, respectively, and common control blocks installed corresponding to a predetermined number of row decoders to simultaneously control the row decoders.

25 Claims, 11 Drawing Sheets

SEMICONDUCTOR MEMORY DEVICE WITH CONTROL BLOCK SHARING ROW DECODERS

CROSS-REFERENCES TO RELATED APPLICATION

The present application claims priority under 35 U.S.C. 119(a) to Korean application number 10-2007-0092873, filed on 13 Sep., 2007, which is incorporated by reference in its entirety as if set forth in full.

BACKGROUND

1. Technical Field

The embodiments described herein relate to a semiconductor memory device and, more particularly, to a semiconductor memory device including a row decoder that controls the operation of mats and word lines of the mats.

2. Related Art

Generally, a conventional semiconductor memory device includes a plurality of banks. Each bank includes a plurality of mats and each mat has a plurality of memory cells.

As is well known, a memory cell in a conventional device includes word lines, bit lines crossing the word lines, switching devices formed at points at which the word lines cross the bit lines, and capacitors in which information of the bit lines is selectively stored by the switching devices.

Figure 1:
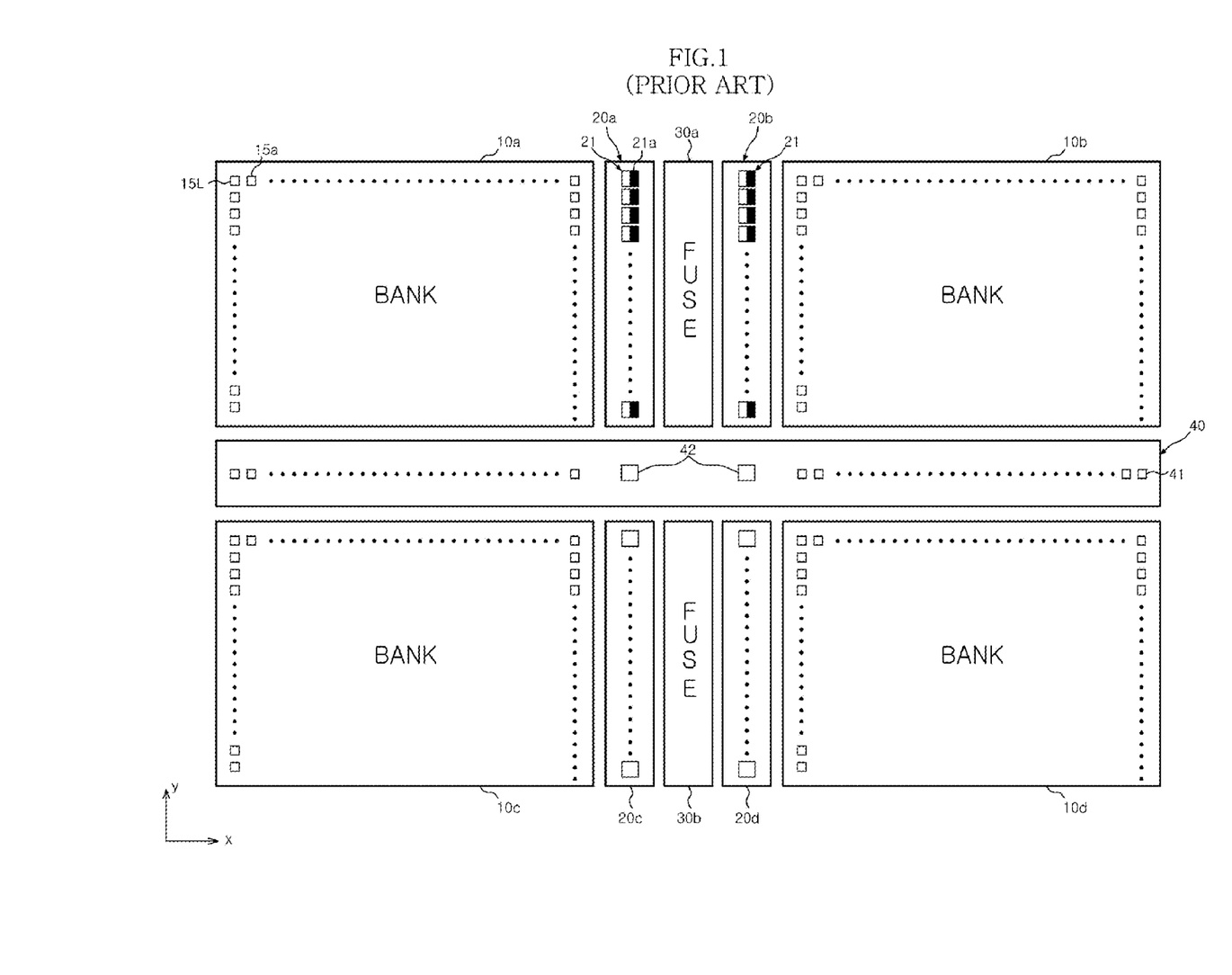
FIG. 1 is a plan view illustrating a general bank arrangement of a conventional semiconductor memory device.

Referring to FIG. 1, a semiconductor memory device, for example, includes four banks BANKs 10a to 10d. In FIG. 1, an x-axis denotes the extending direction of word lines constituting the banks and a y-axis denotes the extending direction of bit lines constituting the banks. Each of the banks 10a to 10d includes a plurality of mats 15a. The mats 15a are arranged in the form of a matrix in the banks 10a to 10d. In FIG. 1, reference numeral 15L denotes groups of mats arranged in the same row, i.e. a mat row.

Generally, row decoder groups 20a and 20b and a fuse unit 30a are disposed between the banks 10a and 10b in the x-axis direction, and row decoder groups 20c and 20d and a fuse unit 30b are disposed between the banks 10a and 10b in the x-axis direction. Each of the row decoder groups 20a to 20d includes a plurality of row decoders 21 disposed corresponding to the mat rows 15L.

As is also well known, each row decoder 21 may include a normal word line buffer unit (not shown), a sense amp selector (not shown), a redundancy word line driving controller (not shown), a row decoder controller 21a, a word line driving unit (not shown), a sense amp driving unit (not shown) and a redundancy word line driving unit (not shown). Among them, the row decoder controller 21a makes up the largest portion of the unit row decoder 21.

The fuse unit 30a includes redundancy cells or fuses (not shown) for correcting a defective word line of the banks 10a and 10b, and the fuse unit 30b includes redundancy cells or fuses (not shown) for correcting a defective word line of the banks 10c and 10d.

Meanwhile, a peripheral area 40 is disposed between the banks 10a and 10c arranged in the y-axis direction and between the banks 10b and 10d arranged in the y-axis direction. In the peripheral area 40, a plurality of pads 41 are disposed in portions corresponding to the banks 10a to 10d, and row address latch decoder blocks 42 that provide latched row address signals are disposed in portions corresponding to the row decoder groups 20a to 20d.

Conventional semiconductor memory devices are incorporating an increasing amount of devices, while still being required to provide high speed operation. Thus, a technology capable of integrating many mats in a limited bank is desirable.

As described above, since the unit row decoders 21 must correspond to the mat rows 15L, as the number of the mats is increased, the number and area of the unit row decoders 21 must also be increased.

However, it is difficult to increase the area of the unit row decoders 21 because the intervals among the banks 10a to 10d are limited.

SUMMARY

According to one aspect, a semiconductor memory device comprises: a plurality of banks including a plurality of mat rows, respectively, in which the mat row includes a plurality of mats disposed in a same row; row decoder groups disposed between the banks and including row decoders that correspond to the mat rows, respectively; and common control blocks installed corresponding to a predetermined number of row decoders to simultaneously control the row decoders. The semiconductor memory device further comprises a fuse group that is disposed between the row decoder groups and includes a plurality of fuse blocks providing a redundancy cell when a defect occurs in the mat, and the common control blocks are disposed in the fuse group. The semiconductor memory device further comprises a row address latch block that provides each row decoder of the row decoder groups with signals associated with an operation of a word line. The semiconductor memory device further comprises a peripheral circuit group that is disposed between the banks and includes pad arrays arranged vertically to the mat rows, and the row address latch block is disposed in the peripheral circuit group.

According to another aspect, a semiconductor memory device comprises: banks including a plurality of mat rows, respectively, wherein the mat row includes a plurality of mats disposed in a same row; row decoder groups disposed corresponding to the mat rows and including a plurality of row decoders that selectively drive word lines of each mat row; a row address latch block generating a row address latch enable signal, which is used for driving the word lines, and a multi row address latch enable signal that groups the mat rows and row decoders into a plurality of mat row blocks including a predetermined number of mat rows and a plurality of row decoder blocks including a predetermined number of row decoders, respectively; and common control blocks installed corresponding to the row decoder blocks and generating a mat block selection signal, which selects one of the mat row blocks, and a row decoder block selection signal, which selects one of the row decoder blocks, by using the multi row address latch enable signal.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

In one embodiment, a semiconductor memory device having a common control block that simultaneously controls a plurality of row decoders is provided. Further, in one embodiment, the common control block is disposed in a fuse group having a relatively high arrangement margin, so that the integration density can be improved in the word line extending direction of the semiconductor memory device. The four-bank structure of a 512M DRAM will be described as an example.

Figure 2:
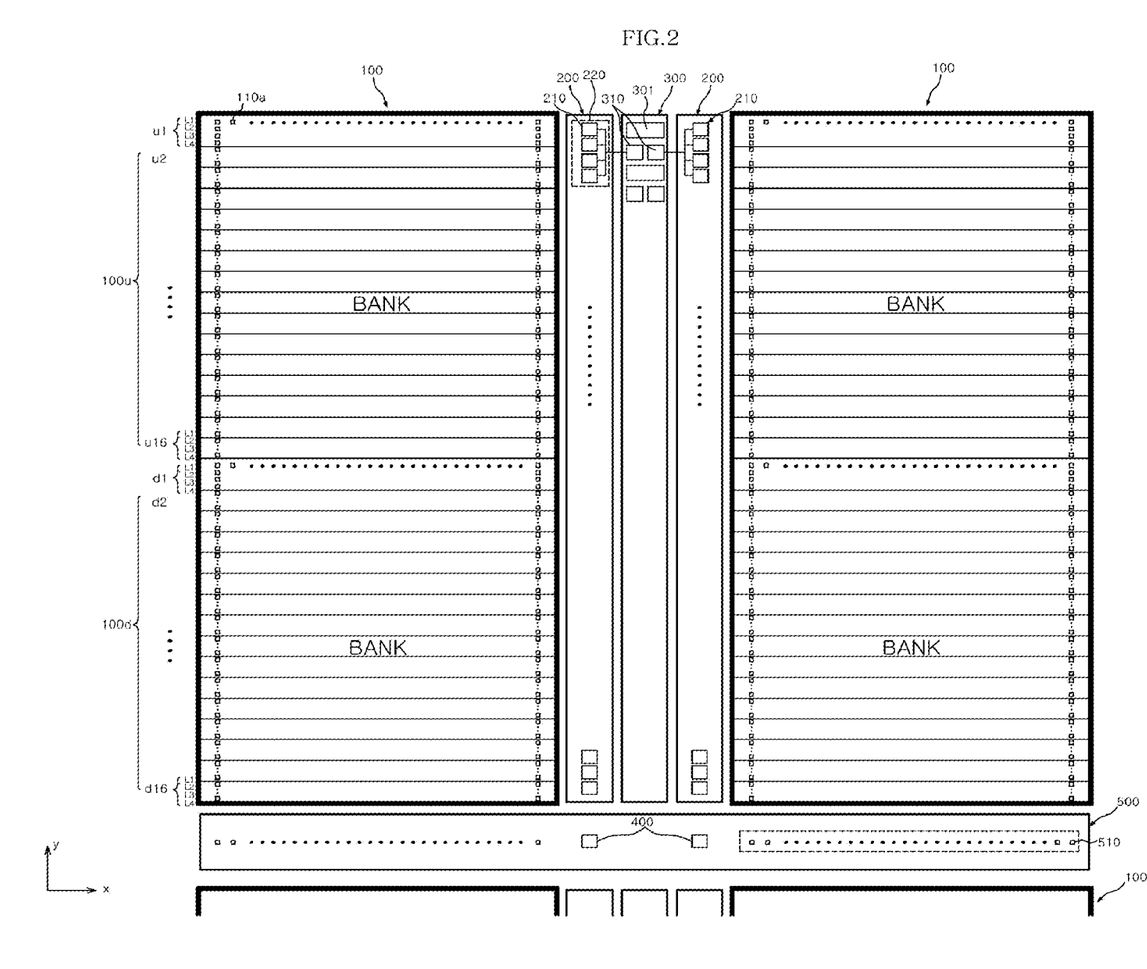
FIG. 2 is a plan view illustrating a arrangement of a semiconductor memory device according to one embodiment.

Referring to FIG. 2, a semiconductor memory device includes a plurality of banks 100, row decoder groups 200, a fuse group 300 and a peripheral circuit group 500.

In the case of a 512M DRAM, four banks 100 may be provided in the semiconductor memory device in 128 Mbit units. However, it will be understood that nor all embodiments are limited thereto. That is, the number of the banks is changeable according to the memory capacity of a DRAM. FIG. 2 is an enlarged view of two of four banks, and the other two banks have the same structure as that shown in FIG. 2.

Such banks 100 are arranged in the form of a matrix at a predetermined interval in the x and y-axes directions in FIG. 2. The x-axis denotes the arrangement direction of word lines of the semiconductor memory device and the y-axis denotes the arrangement direction of bit lines thereof. Each bank 100 includes a plurality of mats 110a arranged in the form of a matrix, and the mats 110a include a plurality of memory cell arrays (not shown). In FIG. 2, reference numeral 100u denotes the upper area of the bank and reference numeral 100d denotes the lower area thereof. For example, if one bank 100 consists of 128M, the bank 100 may include 128 rows, and the upper and lower areas 100u and 100d of the bank include 64 rows, respectively.

The row decoder groups 200 are disposed between the banks 100 arranged in the x-axis direction. The row decoder groups 200 correspond to the banks 100 in an one-to-one fashion. Each row decoder group 200 includes a plurality of row decoders 210. The row decoders 210 correspond to the mat rows L1 to L4 of the bank 100 in such a manner that the row decoders 210 are arranged in the row decoder groups 200 in the y-axis direction, respectively. The row decoders 210 are directly associated with the word line operation of the mats located in the same mat rows L1 to L4, respectively.

The fuse group 300 is disposed between the row decoder groups 200. The fuse group 300 includes a plurality of fuse blocks 301 for replacing defective memory cells (not shown) when the defective memory cells have been generated in the banks 100 located at both sides of the fuse group 300. The fuse blocks 301 include a plurality of redundancy cells and are arranged in parallel in the y-axis direction at a predetermined interval.

Common control blocks 310 are disposed between the fuse blocks 301 in the fuse group 300. Each of the common control blocks 310 is shared by a predetermined number of row decoders 210, e.g. four row decoders, of the row decoder groups 200 adjacent to the fuse group 300, and simultaneously controls the four row decoders 210. That is, the common control block 310 according to one embodiment may correspond to the controller of a general row decoder.

Further, in order to simultaneously operate a predetermined number of row decoders 210, e.g. four row decoders, the common control block 310 generates a signal (hereinafter, referred to as a block grouping signal) that groups the entire mat rows and row decoders into a predetermined number of mat rows and row decoders, e.g. four mat rows and four row decoders, before selecting a specific word line relative to the entire mat rows L1 to L4. In one embodiment, the grouped four mat rows will be referred to as mat blocks u1 to u16 and d1 to d16, and the grouped four row decoders 210 will be referred to as row decoder blocks 220. In one embodiment, the number of the mat rows and row decoders included in the mat blocks u1 to u16 and d1 to d16 and the row decoder blocks 220 is not limited to four, but is changeable without limitation within the range of the divisor of the entire mat rows. Hereinafter, in this embodiment, a case in which four row decoders and four mat rows are controlled by one common control block 310 will be described.

The common control block 310 generates a signal (hereinafter, referred to as block selection signal) for selecting one of the mat blocks u1 to u16 and d1 to d16 and one of the row decoder blocks 220, which correspond to the mat blocks u1 to u16 and d1 to d16, by using the block grouping signal. The block selection signal is input to each row decoder 210 of the selected decoder block 220 to selectively drive the word line of one of the mat rows L1 to L4. The construction and operation of a circuit for selecting a word line will be described in detail later.

The fuse blocks 301 may have a smaller size according to the arrangement of the common control block 310, as compared with conventional devices. The fuse blocks 301 include a plurality of redundancy circuits. Accordingly, the number of the fuse blocks 301 can be reduced, as long as there are no great defects. If the semiconductor memory device has the great defects, the semiconductor memory device cannot be used. Thus, the fuse blocks 301 have the relatively high integration degree in the semiconductor memory device.

Meanwhile, the peripheral circuit group 500 is disposed between the banks arranged in the y-axis direction. The peripheral circuit group 500 includes a plurality of pad arrays 510 and row address latch blocks 400. For example, the pad arrays 510 are disposed corresponding to the banks 100 to provide the banks and the row address latch blocks 400 with a predetermined signal. Further, the row address latch blocks 400 receive the signal from the pad arrays 510 to generate signals for driving the row decoders 210, and are disposed corresponding to the row decoder groups 200.

Hereinafter, the constructions of the row address latch block 400, the common control block 310 and the row decoder 210 will be described in detail in a sequence of signal generation.

Figure 3:
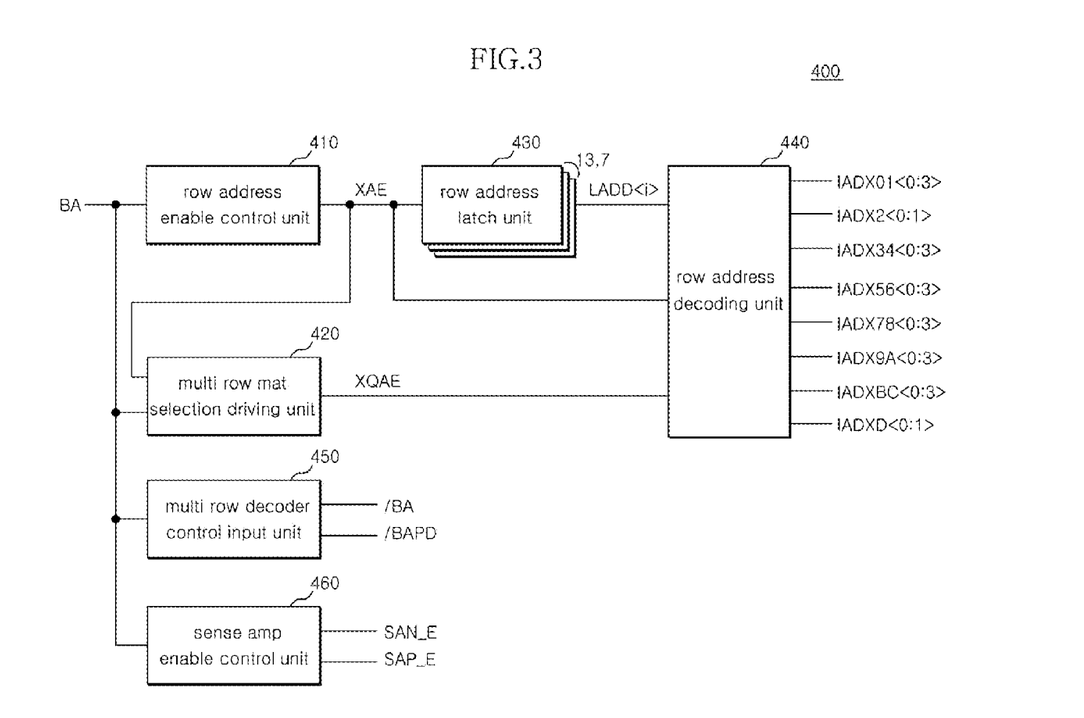
FIG. 3 is a block diagram schematically illustrating a row address latch block of the semiconductor memory device in FIG. 2.

Referring to FIG. 3, the row address latch block 400 includes a row address enable control unit 410, a multi (e.g. quad) row mat selection driving unit 420, a row address latch unit 430, a row address decoding unit 440, a multi (e.g. quad) row decoder control input unit 450, and a sense amp enable control unit 460.

Figure 4:
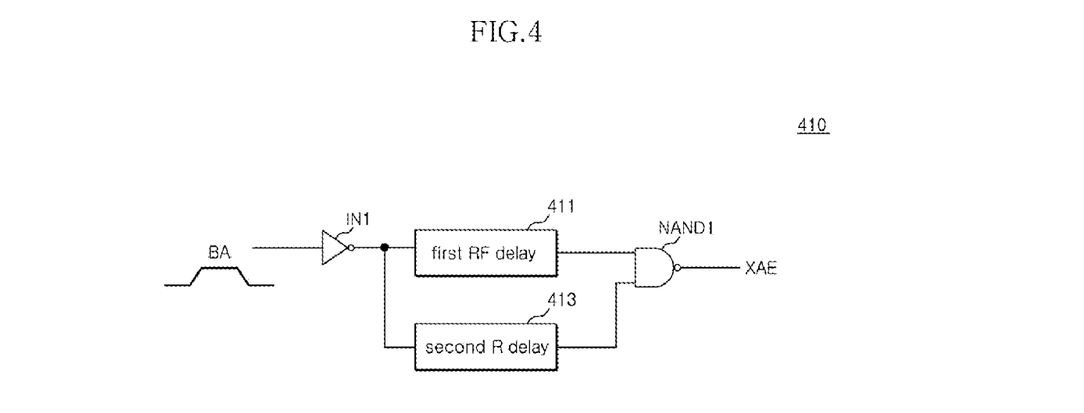
FIG. 4 is a detailed circuit diagram illustrating a row address enable control unit in FIG. 3.

The row address enable control unit 410 generates a row address latch enable signal XAE for maintaining a row address for a predetermined time. The address latch enable signal XAE is used for generating a signal that selects the word line of a specific mat row from the entire mat rows. Further, the row address latch enable signal XAE may be formed by delaying the falling timing of a bank active signal BA by a predetermined time. As shown in FIG. 4, the row address enable control unit 410 includes a first inverter IN1, a first RF delay 411, a first R delay 413 and a first NAND gate NAND1. The first inverter IN1 inverts the bank active signal BA and the first RF delay 411 delays the rising and falling timings of the inverted bank active signal BA. The rising delay by the first RF delay 411 may be smaller than the falling delay by the first RF delay 411. The first R delay 413 delays the rising timing of the inverted bank active signal BA. The first NAND gate NAND1 performs a NAND operation of the output signals of the first RF delay 411 and the first R delay 413 to generate the row address latch enable signal XAE (see FIG. 18). The row address enable control unit 410 is a circuit capable of generating a signal that can delay the falling timing of the bank active signal BA, and may have various types.

The multi (e.g. quad) row mat selection driving unit 420 generates a signal (hereinafter, referred to as a quad row address latch enable signal XQAE) that groups the entire mats and the row decoders 210 into a predetermined number of mat rows, e.g. four mat rows, before one mat row is selected from the entire mat rows. That is, the quad row address latch enable signal XQAE is generated prior to the row address latch enable signal XAE by a predetermined time, and is used for grouping the entire mats into four mat rows. In FIG. 2, the u1 to u16 and d1 to d16 denote the mat blocks grouped according to four mat rows, and a reference numeral 220 denotes the row decoder block including the four row decoders 210 corresponding to the mat block. For instance, in the case of 128M banks according to one embodiment, the bank can include 32 mat blocks c and 32 row decoder blocks 220.

Figure 5:
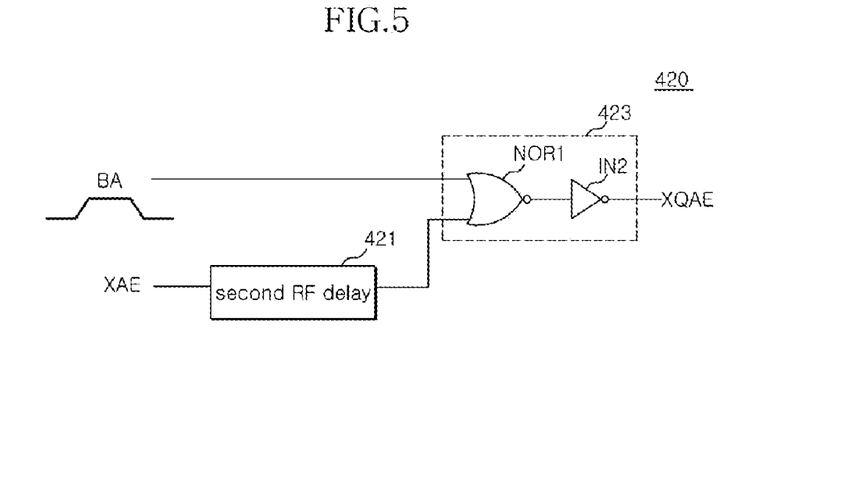
FIG. 5 is a detailed circuit diagram illustrating a quad row mat selection driving unit in FIG. 3.

As shown in FIG. 5, the multi row mat selection driving unit 420 includes a second RF delay 421 and an OR gate 423. The second RF delay 421 receives the row address latch enable signal XAE to delay the rising and falling timings of the row address latch enable signal XAE. The OR gate 423 performs an OR operation of the bank active signal BA and the output signal of the second RF delay 421 to generate the quad row address latch enable signal XQAE. The rising timing of the quad row address latch enable signal XQAE is synchronized with the rising timing of the bank active signal BA, and the falling timing of the quad row address latch enable signal XQAE is synchronized with the falling timing of the row address latch enable signal XAE (see FIG. 18). The OR gate 423 may include a NOR gate NOR1 and a second inverter IN5.

Figure 6:
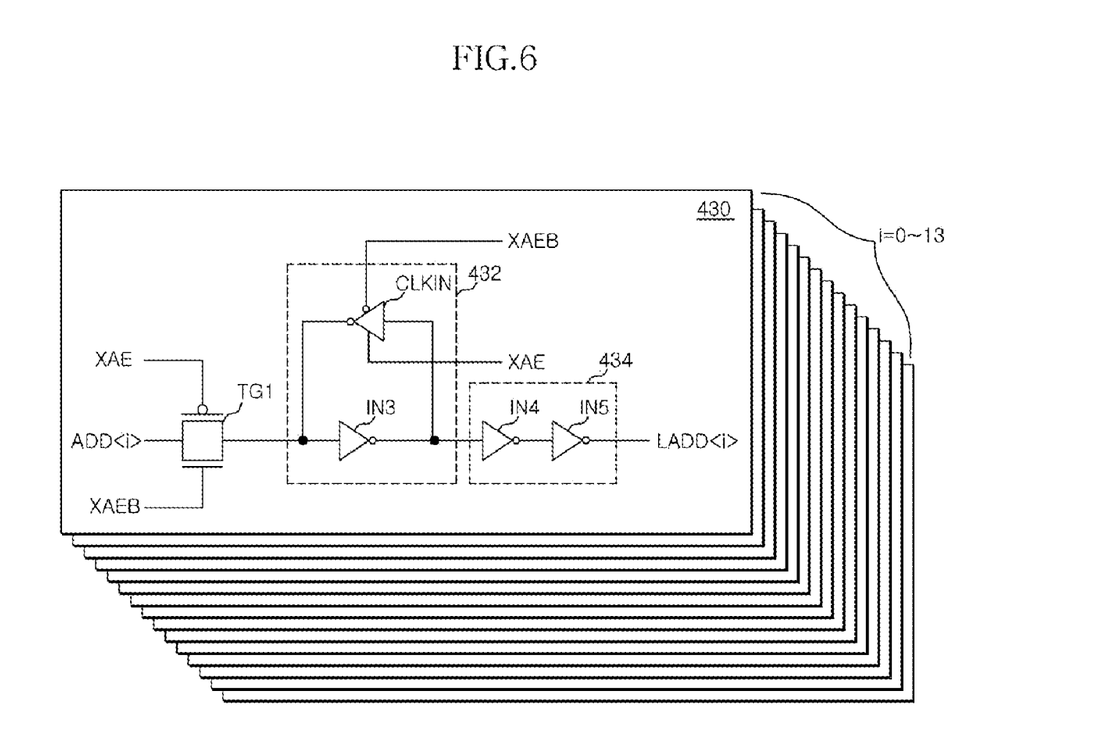
FIG. 6 is a detailed circuit diagram illustrating a row address latch unit in FIG. 3.

The row address latch unit 430 generates a latched address LADD<i> dedicated for a row path. The latched address LADD<i> is an independent address not affected by other commands, and is obtained by the control of the row address latch enable signal XAE. As shown in FIG. 6, the row address latch unit 430 includes a transmission gate TG1, a latch unit 432 and a buffer unit 434. The transmission gate TG1 selectively transmits an address signal ADD<i> according to the row address latch enable signal XAE and an inverted row address latch enable signal XAEB. The latch unit 432 latches the output signal of the transmission gate TG1 by the control of the row address latch enable signal XAE and the inverted row address latch enable signal XAEB. The latch unit 432 includes a third inverter IN3 and a clock inverter CLKIN. The buffer unit 434 delays and buffers the output signal of the latch unit 432 to generate the latched address signal LADD<i> independent of an address change. Such a buffer unit 434 includes a fourth inverter IN4 and a fifth inverter IN5 in series connected to each other. In this embodiment, the number of the row address latch units 430 may corresponding to the number (i=0 to 13) of addresses.

Figure 7:
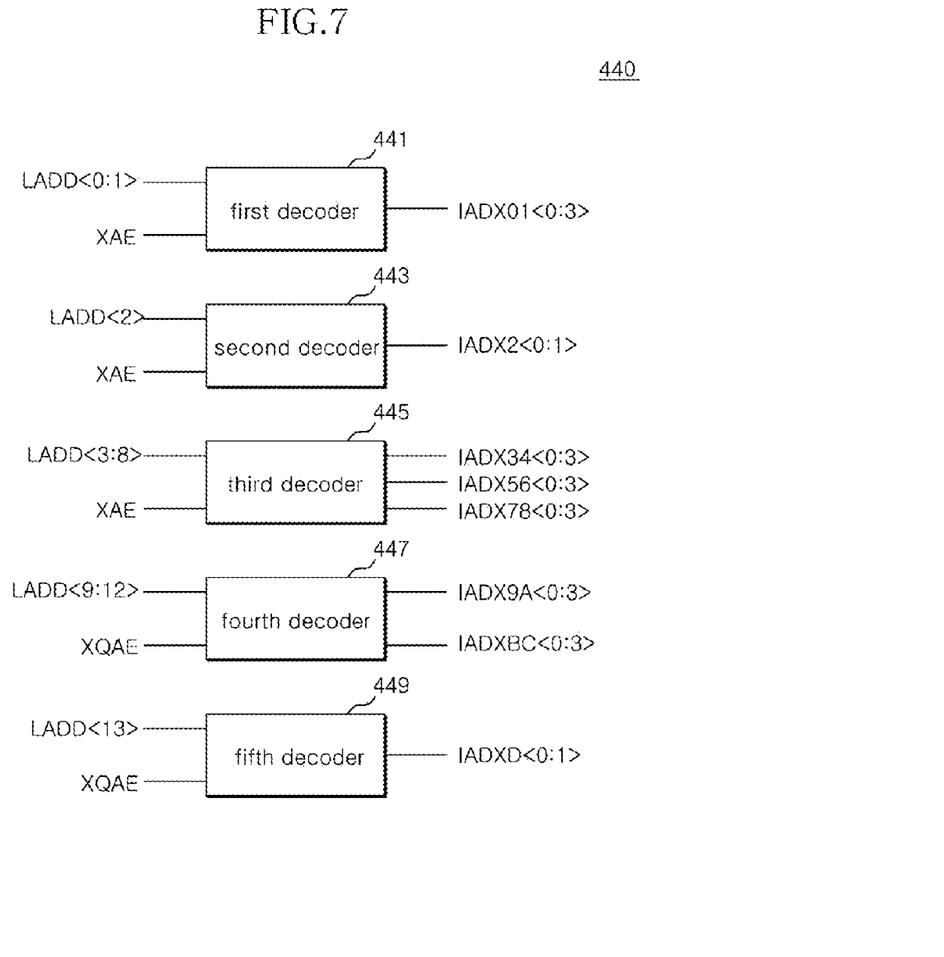
FIG. 7 is a detailed block diagram illustrating a row address decoding unit in FIG. 3.

The row address decoding unit 440 decodes the latched address signal LADD<i> by using the row address latch enable signal XAE and the quad row address latch enable signal XQAE, thereby generating address decoding signals IADX01, IADX2, IADX34, IADX56, IADX78, IADX9A, IADXBC and IADXD. For the convenience of description, the address decoding signals IADX01, IADX2, IADX34, IADX56, IADX78, IADX9A, IADXBC and IADXD will be sequentially called first to eighth address decoding signals. Further, the address decoding signals may be classified into a first group of the address decoding signals (hereinafter referred to as, first address decoding signal group) IADX01, IADX2, IADX34, IADX56 and IADX78, which are generated by using the row address latch enable signal XAE, and a second group of the address decoding signals (hereinafter referred to as, first address decoding signal group) IADX9A, IADXBC and IADXD generated by using the quad row address latch enable signal XQAE.

As shown in FIG. 7, the row address decoding unit 440 includes first to fifth decoders 441, 443, 445, 447 and 449. First, the first decoder 441 receives the $0^{th}$ and $1^{st}$ latched address LADD<0:1> and the row address latch enable signal XAE to generate the first address decoding signal IADX01<0:3>. The second decoder 443 receives the $2^{nd}$ latched address LADD<2> and the row address latch enable signal XAE to generate the second address decoding signal IADX2<0:1>. The third decoder 445 receives the $3^{rd}$ to $8^{th}$ latched address LADD<3:8> and the row address latch enable signal XAE to generate the third to fifth address decoding signals IADX34<0:3>, IADX56<0:3> and IADX78<0:3>. The fourth decoder 447 receives the $9^{th}$ to $12^{th}$ latched address LADD<9:12> and the quad row address latch enable signal XQAE to generate the sixth and seventh address decoding signals IADX9A<0:3> and IADXBC<0:3>. The fifth decoder 449 receives the $13^{th}$ latched address LADD<13> and the quad row address latch enable signal XQAE to generate the eighth address decoding signal IADXD<0:1>.

The first to fifth address decoding signals IADX01<0:3>, IADX2<0:1>, IADX34<0:3>, IADX56<0:3> and IADX78<0:3>, which belong to the first address decoding signal group generated by using the row address latch enable signal XAE, may be used for selecting one (row decoder) of the entire mat rows.

The sixth to eighth address decoding signals IADX9A<0: 3>, IADXBC<0:3> and IADXD<0:1>, which belong to the second address decoding signal group generated by using the quad row address latch enable signal XQAE, may be used for selecting one (and row decoder block) of the mat blocks u1 to u16 and d1 to d16 or the row decoder block 220

In this embodiment, the 13$^{th}$ latched address LADD<13> is used for selecting the upper area 100$u$ or the lower area 100$d$ of the selected bank 100, and the 9$^{th}$ to 12$^{th}$ latched address LADD<9:12> is used for selecting one mat block from the upper area 100$u$ or the lower area 100$d$ of a specific bank selected by the 13$^{th}$ latched address LADD<13>.

Figure 8:
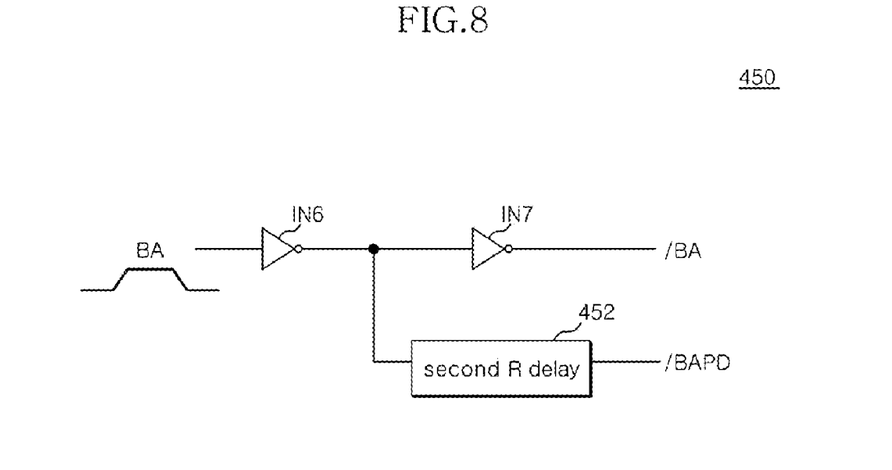
FIG. 8 is a detailed circuit diagram illustrating a quad row decoder control unit in FIG. 3.

The multi row decoder control input unit 450 generates control signals to be provided to the common control block 310, e.g. an inverted bank active signal /BA and an inverted and delayed bank active signal /BAPD. Referring to FIG. 8, the multi row decoder control input unit 450 includes a sixth inverter IN6, a seventh inverter IN7 and a second R delay 452. The sixth inverter IN6 inverts the bank active signal BA and the seventh inverter IN7 inverts the output signal of the sixth inverter IN6. The second R delay 452 receives the output signal of the sixth inverter IN6 and delays the rising timing of the received output signal to generate the inverted and delayed bank active signal /BAPD.

The sense amp enable control unit 460 generates sense amp timing control signals SAN_E and SAP_E for determining the operation timing of a sense amp (not shown) of the mat 110$a$. The sense amp timing control signals SAN_E and SAP_E are generated by using the bank active signal BA.

Figure 9:
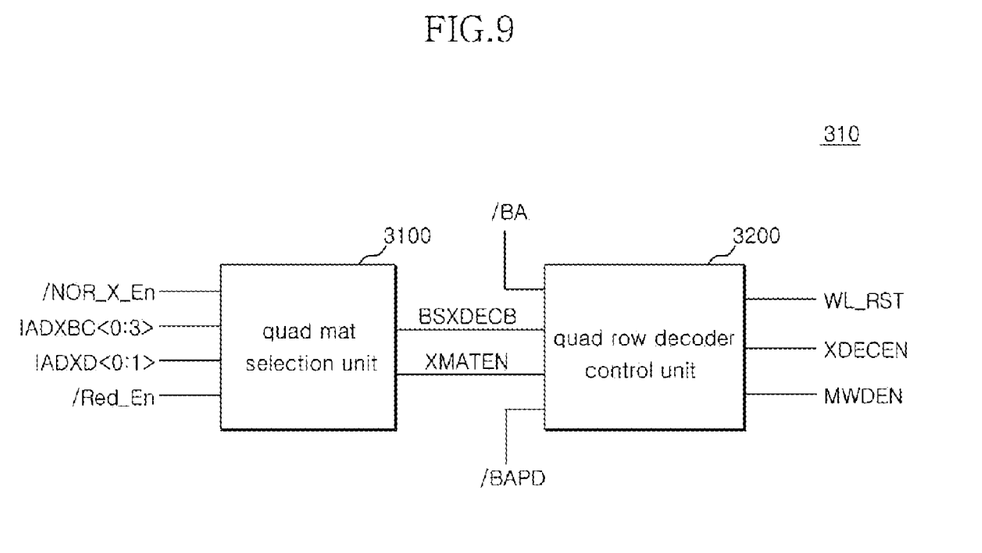
FIG. 9 is a block diagram schematically illustrating a common control block in FIG. 2.

The common control block 310 generates a signal for controlling the mat rows and the row decoders in the unit of block (e.g. by the four blocks) by using the signals provided by the row address latch blocks 400. As shown in FIG. 9, such a common control block 310 includes a quad mat selection unit 3100 and a quad row decoder control unit 3200. Although the quad mat selection unit 3100 and the quad row decoder control unit 3200 are employed in this embodiment to simultaneously control the four row decoders and row mats, the quad mat selection unit 3100 and the quad row decoder control unit 3200 may be a multi mat selection unit and a multi row decoder control unit, respectively.

The quad mat selection unit 3100 receives an inverted normal word line enable signal /NOR_X_En, a seventh address decoding signal IADXBC<0:3>, an eighth address decoding signal IADXD<0:1> and a redundancy enable signal /Red_En to generate a mat block selection signal XMATEN and a row decoder block selection signal BSXDECB. The inverted normal word line enable signal /NOR_X_En includes fuse information that represents if the word line normally operates or performs a redundancy operation. For example, if any one fuse (not shown) is cut, the inverted normal word line enable signal /NOR_X_En has a low level. However, if the fuse is not cut (i.e. in the normal state), the inverted normal word line enable signal /NOR_X_En has a high level. As described above, the seventh address decoding signal IADXBC<0:3> is associated with each mat block including the four mat rows L1 to L4 of the selected bank area (i.e. the upper or lower area of the bank), and the eighth address decoding signal IADXD<0:1> selects the upper area 100$u$ or lower area 100$d$ of the bank. Further, the redundancy enable signal /Red_En is enabled if any one fuse is cut and includes the fuse information.

Figure 10:
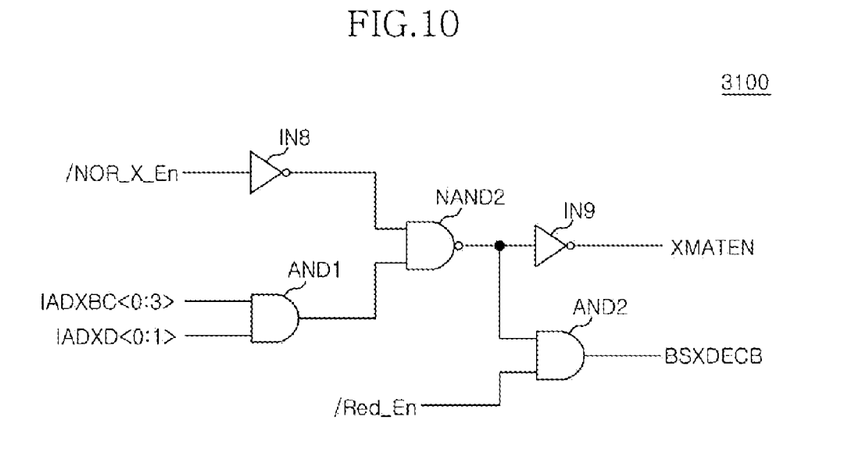
FIG. 10 is a detailed circuit diagram illustrating a quad mat selection unit in FIG. 9.

In more detail, as shown in FIG. 10, the quad mat selection unit 3100 includes an eighth inverter IN8, a first AND gate AND1, a second NAND gate NAND2, a ninth inverter IN9 and a second AND gate AND2. The eighth inverter IN8 inverts the inverted normal word line enable signal /NOR_X_En. The first AND gate AND1 performs an AND operation of the seventh address decoding signal IADXBC<0:3> and the eighth address decoding signal IADXD<0:1>. Theoretically, the sixth address decoding signal IADX9A<0:3> must also be inputted to the first AND gate AND1. However, the sixth address decoding signal IADX9A<0:3> does not exert influence on the operation of the first AND gate AND1. Thus, only the seventh address decoding signal IADXBC<0:3> is provided to the first AND gate AND1 according to one embodiment.

The second NAND gate NAND2 performs a NAND operation of the output signal of the ninth inverter IN9 and the output signal of the first AND gate AND1. The ninth inverter IN inverts the output signal of the second NAND gate NAND2 to generate the mat block selection signal XMATEN for selecting the mat blocks u1 to u16 and d1 to d16 in the normal state.

The second AND gate AND2 performs an And operation of the output signal of the second NAND gate NAND2 and the inverted redundancy enable signal /Red_En to generate the row decoder block selection signal BSXDECB corresponding to the mat block selection signal XMATEN. In the case of a normal operation, the mat block selection signal XMATEN and the row decoder block selection signal BSXDECB may have the same type. In the case of a redundancy operation, the mat block selection signal XMATEN and the row decoder block selection signal BSXDECB may have types different from each other.

The quad row decoder control unit 3200 receives the mat block selection signal XMATEN, the row decoder block selection signal BSXDECB, the inverted bank active signal /BA and the inverted and delayed bank active signal /BAPD, and then generates signals for controlling the four row decoders, e.g. a word line reset signal WL_RST, a row decoder enable signal XDECEN and a main word line enable signal MWDEN.

Figure 11:
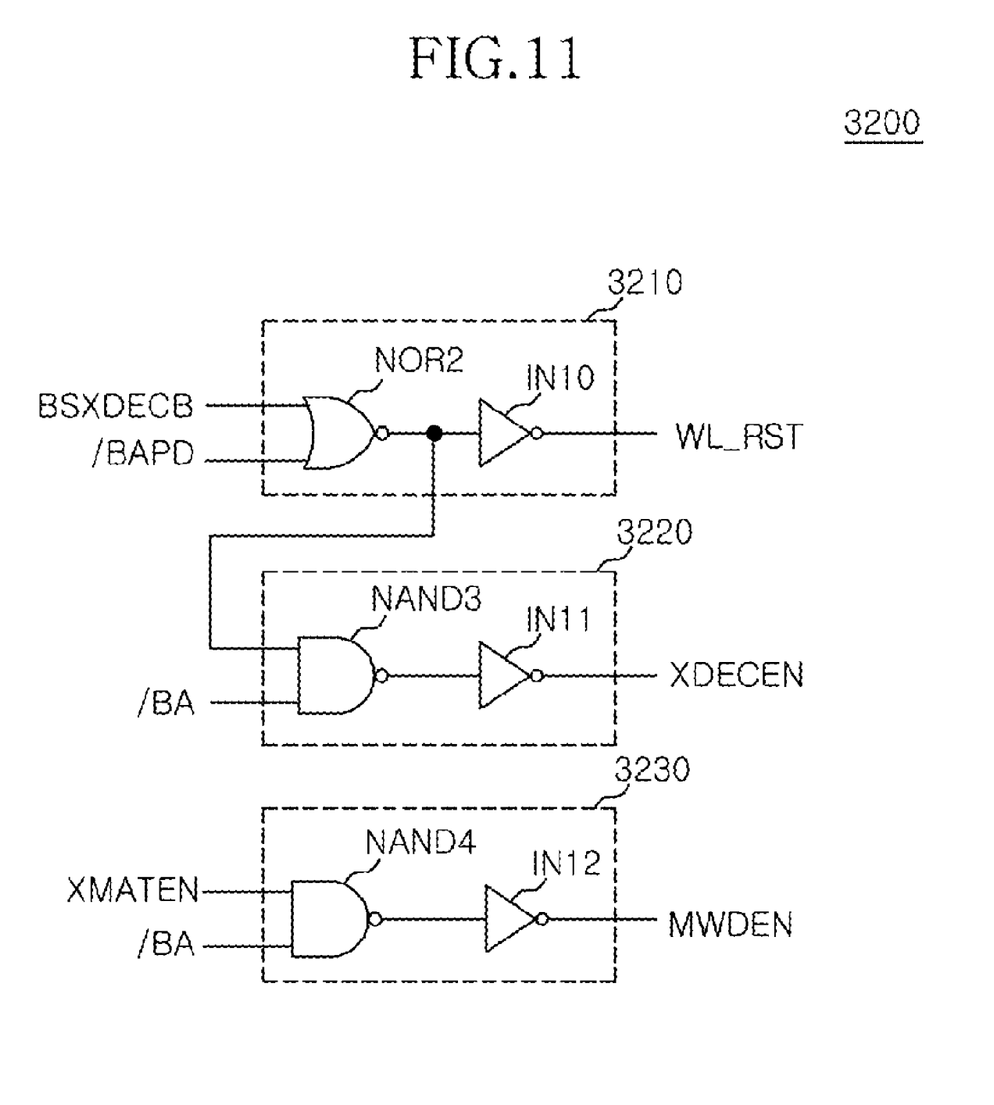
FIG. 11 is a detailed circuit diagram illustrating a quad row decoder control unit in FIG. 9.

In more detail, as shown in FIG. 11, the quad row decoder control unit 3200 includes a first circuit unit 3210, a second circuit unit 3220 and a third circuit unit 3230. The first circuit unit 3210 receives the row decoder block selection signal BSXDECB and the inverted and delayed bank active signal /BAPD to generate the word line reset signal WL_RST. The first circuit unit 3210 includes a second NOR gate NOR2, which receives the row decoder block selection signal BSXDECB and the inverted and delayed bank active signal /BAPD, and a tenth inverter IN10 that inverts the output signal of the second NOR gate NOR2 to output the word line reset signal WL_RST. That is, the first circuit unit 3210 generates the word line reset signal WL_RST that stops the operation of a word line in a redundancy mode or in a precharge period.

The second circuit unit 3220 receives the inverted bank active signal /BA and the output signal of the second NOR gate NOR2 to generate the row decoder enable signal XDECEN. The second circuit unit 3220 includes a third NAND gate NAND3, which receives the inverted bank active signal /BA and the output signal of the second NOR gate NOR2, and an eleventh inverter IN11 that inverts the output signal of the third NAND gate NAND3. The row decoder enable signal XDECEN can be used for generating a signal that selects a sub-word line associated with one word line.

The third circuit unit 3230 receives the mat block selection signal XMATEN and the inverted bank active signal /BA to generate the main word line enable signal MWDEN for driving the main word line of a selected mat block. The third circuit unit 3230 includes a fourth NAND gate NAND4, which receives the mat block selection signal XMATEN and the inverted bank active signal /BA, and an twelfth inverter IN12 that inverts the output signal of the fourth NAND gate NAND4. The main word line enable signal MWDEN is obtained by performing an AND operation of the mat block selection signal XMATEN and the inverted bank active signal /BA, and is used for enabling the main word line of a selected one mat row.

Figure 12:
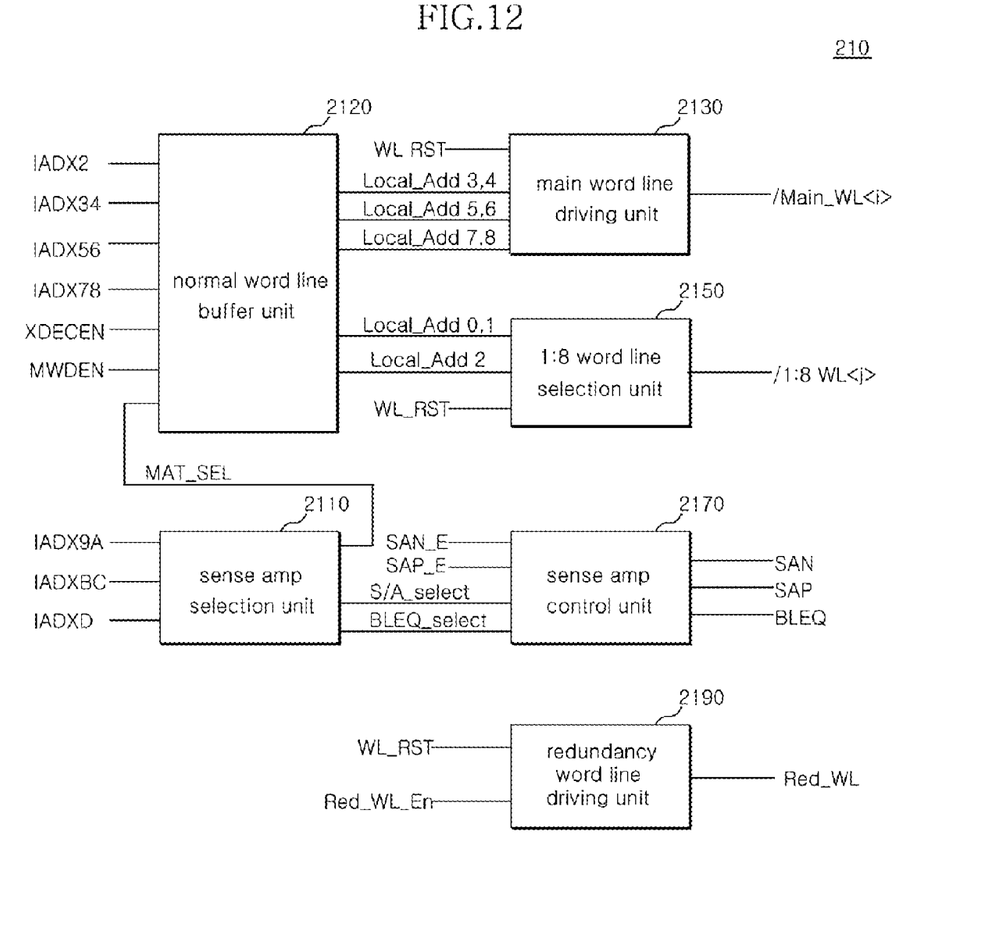
FIG. 12 is a block diagram schematically illustrating a row decoder of the semiconductor memory device in FIG. 2.

The row decoder 210 includes a sense amp selection unit 2110, a normal word line buffer unit 2120, a main word line driving unit 2130, a 1:8 word line selection unit 2150, a sense amp control unit 2170 and a redundancy word line driving unit 2190.

Figure 13:
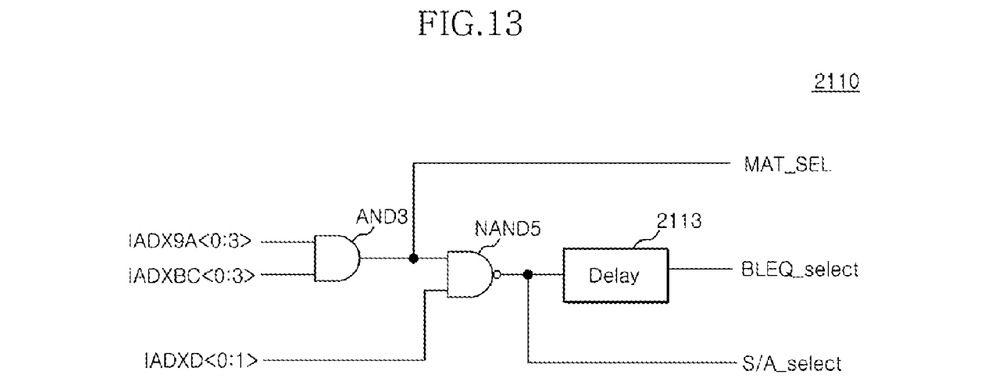
FIG. 13 is a detailed circuit diagram illustrating a normal word line buffer unit in FIG. 12.

The sense amp selection unit 2110 receives the sixth to eighth address decoding signals IADX9A<0:3>, IADXBC<0:3> and IADXD<0:1>, which are associated with the selection of the mat blocks u1 to u16 and d1 to d16, and then generates a mat row selection signal MAT_SEL for selecting one mat row from a selected mat block, a signal (sense amp selection signal) S/A_select for selecting the sense amp of the selected mat row, and a bit line equalizing selection signal BELQ_select of the selected mat row. As shown in FIG. 13, the sense amp selection unit 2110 includes a third AND gate AND3, a fifth NAND gate NAND5 and a delay 2113. The third AND gate AND3 receives and performs an AND operation of the sixth and seventh address decoding signals IADX9A<0:3> and IADXBC<0:3> to generate the mat row selection signal MAT_SEL. That is, since the sixth and seventh address decoding signals IADX9A<0:3> and IADXBC<0:3> are associated with a mat block, i.e. four mat rows, the mat row selection signal MAT_SEL for selecting one of the four mat rows can be generated through a combination of the sixth and seventh address decoding signals IADX9A<0:3> and IADXBC<0:3>. Further, the fifth NAND gate NAND5 performs a NAND operation of the output signal of the third AND gate AND3 and the eighth address decoding signal IADXD<0:1> to generate the sense amp selection signal S/A_select. The delay 2113 receives the sense amp selection signal S/A_select, and then delays the sense amp selection signal S/A_select for a predetermined time to generate the bit line equalizing selection signal BELQ_select.

The normal word line buffer unit 2120 receives the second to fifth address decoding signals IADX2, IADX34, IADX56 and IADX78 generated by the row address latch block 400, the row decoder enable signal XDECEN, the main word line enable signal MWDEN and the mat row selection signal MAT_SEL, and then generates local address signals Local_Add<2:8>.

Figure 14:
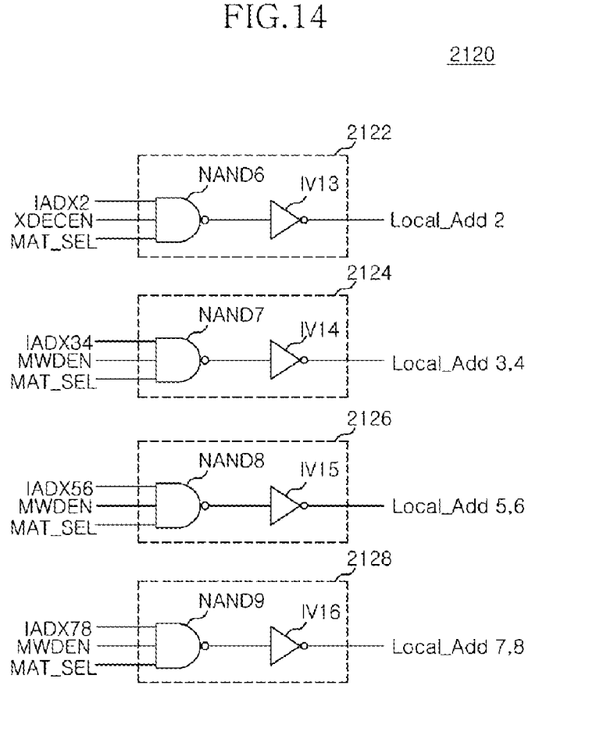
FIG. 14 is a detailed circuit diagram illustrating a main word line driving unit in FIG. 12.

As shown in FIG. 14, the normal word line buffer unit 2120 includes first to fourth local address generators 2122, 2124, 2126 and 2128.

The first local address generator 2122 receives the second address decoding signal IADX2, the row decoder enable signal XDECEN and the mat row selection signal MAT_SEL to generate the first local address signal Local_Add 2. Since the first local address signal Local_Add 2 is generated by using the mat row selection signal MAT_SEL and the row decoder enable signal XDECEN associated with the operation of a sub-word line, the first local address signal Local_Add 2 is used for driving the sub-word line of a specific mat row.

The second local address generator 2124 receives the third address decoding signal IADX34, the main word line enable signal MWDEN and the mat row selection signal MAT_SEL to generate the second local address signals Local_Add 3,4.

The third local address generator 2126 receives the fourth address decoding signal IADX56, the main word line enable signal MWDEN and the mat row selection signal MAT_SEL to generate the third local address signals Local_Add 5,6.

The fourth local address generator 2128 receives the fifth address decoding signal IADX78, the main word line enable signal MWDEN and the mat row selection signal MAT_SEL to generate the fourth local address signals Local_Add 7,8.

The first to fourth local address generators 2122, 2124, 2126 and 2128 can perform an AND operation, and include NAND gates NAND6 to NAND9 and inverters IV13 to IV16 that invert the output of the NAND gates NAND6 to NAND9. Since the second to fourth local address signals Local_Add 34,56,78 are generated by using the mat row selection signal MAT_SEL and the main word line enable signal MWDEN, the second to fourth local address signals Local_Add 34,56, 78 are used for driving a main word line corresponding to one mat row of a mat block including four mat rows.

Figure 15:
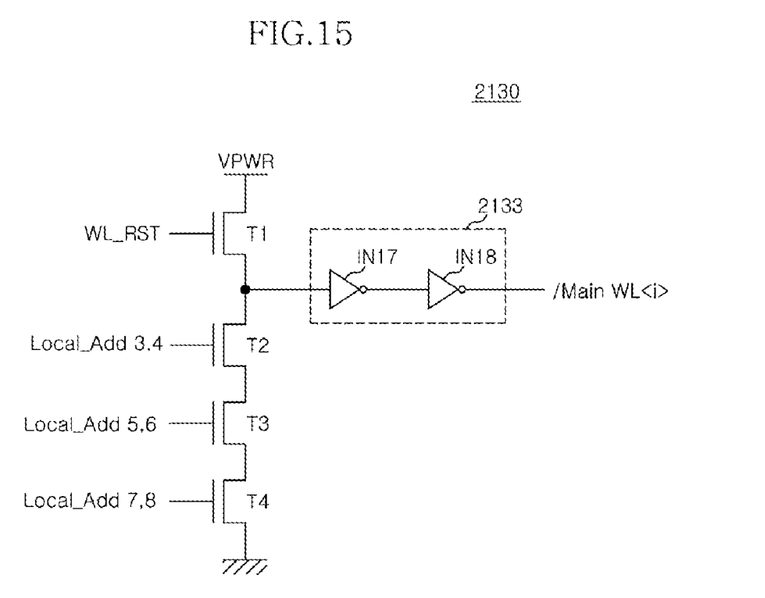
FIG. 15 is a detailed circuit diagram illustrating a 1:8 word line selection unit in FIG. 12.

The main word line driving unit 2130 receives the word line reset signal WL_RST and the second to fourth local address signals Local_Add 34,56,78 to generate a signal (a word line driving signal) /Main_WL<i> for driving a main word line. As shown in FIG. 15, the main word line driving unit 2130 includes first to fourth transistors T1 to T4 and a buffer unit 2133. For example, the first to fourth transistors T1 to T4 may be NMOS transistors in series connected to each other. The first transistor T1 is turned on by the word line reset signal WL_RST to transmit power voltage VPWR to the second transistor T2. The second transistor T2 is turned on by the second local address signals Local_Add 3,4 to provide a signal, which is outputted from the first transistor T1, to the third transistor T3. The third transistor T3 is turned on by the third local address signals Local_Add 5,6 to provide a signal, which is outputted from the second transistor T2, to the fourth transistor T4. The fourth transistor T4 is turned on by the fourth local address signals Local_Add 7,8 to provide a signal, which is outputted from the third transistor T3, to the ground. The buffer unit 2133 is connected between the first transistor T1 and the second transistor T2 to buffer voltage of the contact point node of the first transistor T1 and the second transistor T2, thereby generating the word line driving signal /Main_WL<i> for driving a word line of a selected mat row. Such a buffer unit 2133 includes a pair of inverters IN17 and IN18 in series connected to each other. Further, the main word line driving unit 2130 as described above continuously drives a main word line as long as the word line reset signal WL_RST is not enabled. For example, the main word line driving unit 2130 of this embodiment receives the six local address signals Local_Add 34,56,78 such that the main word line driving unit 2130 can generate 64 main word line driving signals /Main_WL<i>. However, this embodiment is not limited thereto. That is, the number of main word line driving signals can be adjusted according to the number of mat rows.

Figure 16:
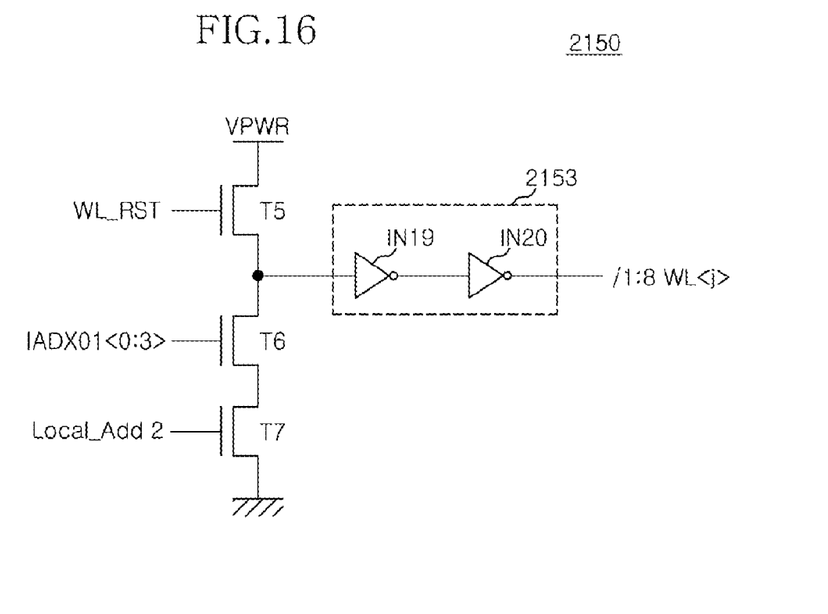
FIG. 16 is a detailed circuit diagram illustrating a sense amp selection unit in FIG. 12.

The 1:8 word line selection unit 2150 receives the word line reset signal WL_RST, the first address decoding signal IADX01<0:3> and the first local address signal Local_Add 2 to generate an inverted 1:8 word line selection signal /1:8 WL<j>. As well known, when one main word line driving signal /Main_WL<i> is selected, the 1:8 word line selection signal 1:8 WL<j> selects and drives 8 sub-word lines associated with the selected main word line driving signal /Main_WL<i>. As shown in FIG. 16, the 1:8 word line selection unit 2150 includes fifth to seventh transistors T5 to T7 and a buffer unit 2153. For example, the fifth to seventh transistors T5 to T7 may be NMOS transistors in series connected to each other. The fifth transistor T5 is turned on by the word line reset signal WL_RST to transmit power voltage VPWR to the sixth transistor T6. The sixth transistor T6 is turned on by the first address decoding signal IADX01<0:3> to provide a signal, which is outputted from the fifth transistor T5, to the seventh transistor T7. The seventh transistor T7 is turned on by the second local address signals Local_Add 2 to provide a signal, which is outputted from the sixth transistor T6, to the ground. The buffer unit 2153 includes a pair of inverters IN19 and IN20 in series connected to each other, and is connected between the fifth transistor T5 and the sixth transistor T6 to buffer voltage of the contact point node of the fifth transistor T5 and the sixth transistor T6, thereby generating the inverted 1:8 word line selection signal /1:8 WL<j> (j is 0 to 7). Further, the 1:8 word line selection unit 2150 as described above continuously performs 1:8 sub-word line coding as long as the word line reset signal WL_RST is not enabled. In one embodiment, the 1:8 word line selection unit 2150 is installed in the row decoder group 200. However, the 1:8 word line selection unit 2150 may also be disposed in the sub-word line block of each mat.

The sense amp control unit 2170 receives the sense amp operation timing control signals SAN_E and SAP_E generated by the row address latch block 400, and the sense amp selection signal S/A_select and the bit line equalizing selection signal BELQ_select, which are generated by the sense amp selection unit 2110, and then generates sense amp control signals SAN and SAP and a bit line equalizing signal BELQ. The sense amp control signals SAN and SAP and the bit line equalizing signal BELQ are used for driving one of the sense amps corresponding to one of the mat rows L1 to LN of any one of selected mat blocks u1 to u16 and d1 to d16.

Figure 17:
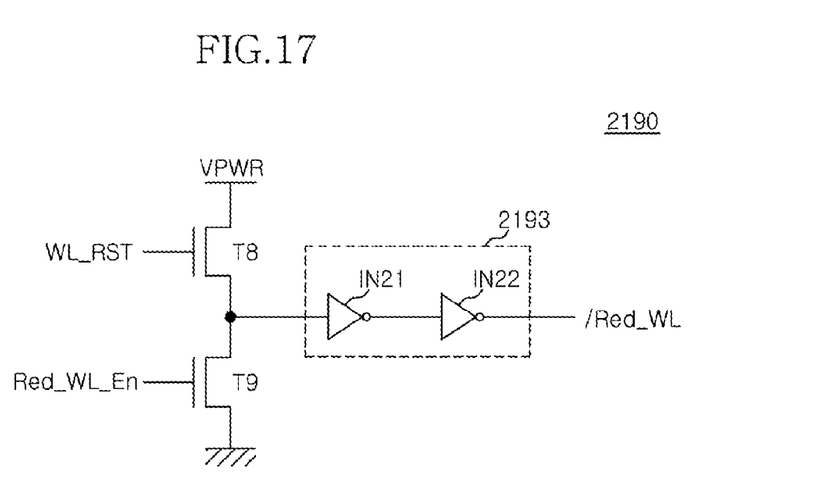
FIG. 17 is a detailed circuit diagram illustrating a redundancy word line driving unit in FIG. 12.

The redundancy word line driving unit 2190 receives a redundancy word line enable signal Red_WL_En and the word line reset signal WL_RST to generate a redundancy word line signal /Red_WL. That is, the redundancy word line driving unit 2190 is driven when the word line reset signal WL_RST or the redundancy word line enable signal Red_WL_En is enabled. As shown in FIG. 17, the redundancy word line driving unit 2190 includes eighth and ninth transistors T8 and T9 and a buffer unit 2193. For example, the eighth and ninth transistors T8 and T9 may be NMOS transistors, and in series connected between the power voltage source and the ground. The eighth transistor T8 is turned on by the word line reset signal WL_RST to transmit power voltage VPWR to the ninth transistor T9. The ninth transistor T9 is turned on by the redundancy word line enable signal Red_WL_En to provide a signal, which is outputted from the eighth transistor T8, to the ground. The buffer unit 2193 includes a pair of inverters IN21 and IN22 in series connected to each other, and is connected between the eighth and ninth transistors T8 and T9 to buffer voltage of the contact point node of the eighth and ninth transistors T8 and T9, thereby generating an inverted redundancy word line Red_WL. The buffer unit 2193 includes a pair of inverters IN27 and IN28 continuously connected.

That is, the row decoder 210 of this embodiment receives the mat selection signal XMATEN provided from the common control block 310, the main word line enable signal MWDEN generated using the mat selection signal XMATEN, and the mat row selection signal MAT_SEL, and then drives word lines of one mat row in the selected mat block.

Hereinafter, the operation of the semiconductor memory device according to one embodiment will be described.

As described above, the semiconductor memory device of the embodiment includes the common control block 310 that simultaneously controls a plurality of (e.g. four) row decoders 210, and the common control block 310 is provided in the fuse group 300.

According to one embodiment, in order to control the row decoder block 220 including a plurality of (e.g. four) row decoders 210 by using one common control block 310, that is, in order to control the mat block including four mat rows, the quad row address latch enable signal XQAE for grouping the mat rows of the bank into four mat rows is obtained using the circuit construction of FIG. 5 before the row address latch enable signal XAE for latching the existing row address is generated.

During the enable period of the quad row address latch enable signal XQAE before the row address latch enable signal XAE is generated, the second address decoding signal group (the sixth to eighth address decoding signals IADX9A<0:3>, IADXBC<0:3> and IADXD<0:1>) is generated using the $13^{th}$ latched address signal LADD<13>, which is used for selecting the upper area or the lower area of the bank area, and the $11^{th}$ and $12^{th}$ latched address signals LADD<12,13> (see FIG. 7).

The sixth to eighth address decoding signals IADX9A<0:3>, IADXBC<0:3> and IADXD<0:1> are inputted to the common control block 310 of the fuse group 300. Then, the common control block 310 generates the mat selection signal XMATEN that selects one (row decoder block) of the mat blocks (row decoder blocks) by using combinations of the sixth to eighth address decoding signals IADX9A<0:3>, IADXBC<0:3> and IADXD<0:1> and the fuse information /NOR_X_En. In addition, the common control block 310 generates the main word line enable signal MWDEN of a mat row by using the mat selection signal XMATEN and the bank active signal BA.

Meanwhile, the sense amp selection unit 2110 of the row decoder 210 generates the mat row selection signal MAT_SEL, which selects one of the four mat rows, by using an AND combination of the sixth and seventh address decoding signals IADX9A<0:3> and IADXBC<0:3>. The mat row selection signal MAT_SEL is inputted as a control signal of the normal word line buffer unit 2120 that generates the local address signals Local_Add 1 to 8, so that the main word line driving signal /Main_WL<i>, in which the mat row selection has been reflected, and the sub-word line driving signal (i.e. word line signal for 1:8 coding) can be obtained.

Figure 18:
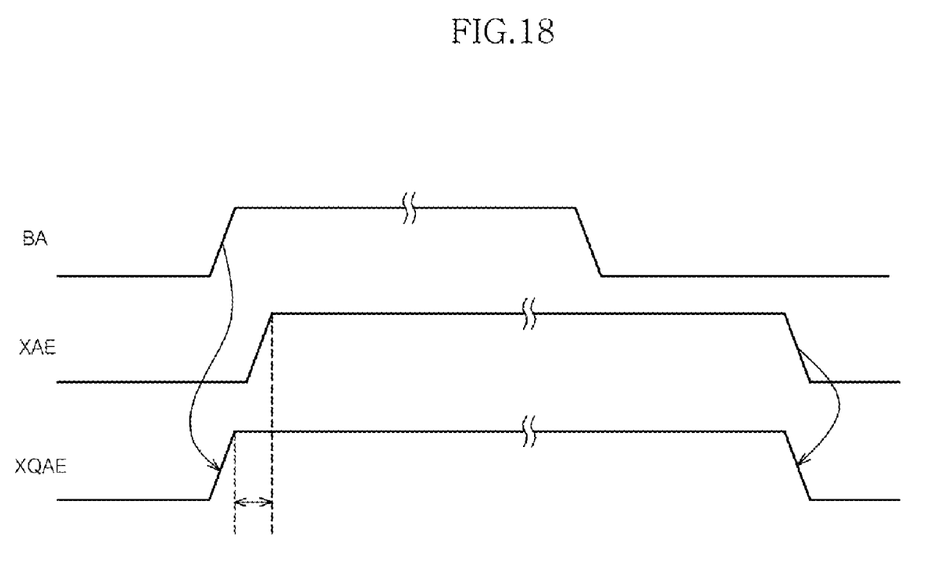
FIG. 18 is a timing chart illustrating an operation of a row address latch block according to one embodiment.

Referring to FIG. 18, the row address latch enable signal XAE is generated using the bank active signal BA. The row address latch enable signal XAE is generated by the first RF delay 411 after a predetermined lapse. The quad row address latch enable signal XQAE is generated in synchronization with the rising timing of the bank active signal BA and the falling timing of the row address latch enable signal XAE. Accordingly, the quad row address latch enable signal XQAE is enabled prior to the row address latch enable signal XAE, and controls the common control block 310 such that the mat selection signal XMATEN for selecting four mat blocks and the row decoder block selection signal BSXDECB for selecting four row decoder blocks can be generated before the row address latch enable signal XAE is enabled.

Accordingly, the four row decoders 210 can be controlled by one common control block 310. The common control block 310 is disposed in the fuse group 300, so that the area of the row decoder group 200 can be reduced by the area of each controller of the row decoders. As described above, a plurality of row decoders exist in the row decoder group and the controllers of the row decoders take up the bulk of the row decoder block, so that the area of the row decoders can be significantly reduced. In addition, the entire area of the row decoder group, in which the row decoders are integrated, can also be significantly reduced.

As a result, the area in the word line direction of the semiconductor memory device can be significantly reduced.

It will be understood that the embodiments described above are by way of example only.

According to one embodiment, the four row decoders and mat rows are simultaneously controlled by one common control block. However, this embodiment is not limited thereto. The row decoders and the mat rows can be shared within the range of the divisor of the entire mat rows constituting the bank.

Further, according to such an embodiment, the 512M 4 bank structure is described as an example. However, the number of banks and address signals is changeable in proportion to the integration degree and the number of banks.

Furthermore, according to such an embodiment, the row address decoding unit 440 includes five decoders. However, the embodiments described herein are not limited thereto. The row address decoding unit 440 can be freely designed.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device comprising:
   a plurality of banks including a plurality of mat rows, respectively, wherein each of the plurality of mat rows includes a plurality of mats;
   a plurality of row decoder groups disposed between the plurality of banks and each of the plurality of row decoder groups including row decoders that correspond to the mat rows; and
   a plurality of common control blocks corresponding to a predetermined number of row decoders and configured to simultaneously control the predetermined number of the row decoders,
   wherein the plurality of common control blocks are allocated per one bank.

2. The semiconductor memory device of claim 1, further comprising a fuse group that is disposed between the plurality of row decoder groups and includes a plurality of fuse blocks providing a redundancy cell when a defect occurs in a mat, wherein the plurality of common control blocks are disposed in the fuse group.

3. The semiconductor memory device of claim 1, further comprising a row address latch block that provides each row decoder of the plurality of row decoder groups with signals associated with an operation of a word line.

4. The semiconductor memory device of claim 3, further comprising a peripheral circuit group that is disposed between the plurality of banks and includes pad arrays arranged vertically to the mat rows, wherein the row address latch block is disposed in the peripheral circuit group.

5. The semiconductor memory device of claim 3, wherein the row address latch block generates signals for grouping all the mat rows in each of the plurality of bank and the plurality of row decoders into a plurality of mat row blocks including a selected number of mat rows and a plurality of row decoder blocks including a selected number of row decoders, respectively.

6. The semiconductor memory device of claim 5, wherein the common control block receives the grouping signals to generate a signal for selecting one of the mat row blocks and a signal for selecting one of the row decoder blocks.

7. The semiconductor memory device of claim 6, wherein row decoders in the selected row decoder block are configured to generate a signal for selecting one of the selected number of row decoders and drive a word line of the mat row corresponding to the selected row decoder when the selected row decoder is selectively driven by the selecting signal.

8. A semiconductor memory device comprising:
   a plurality of bank, each of the plurality of bank including a plurality of mat rows, wherein each of the plurality of mat rows includes a plurality of mats;
   a plurality of row decoder groups corresponding to the mat rows and each of the plurality of row decoder groups including a plurality of row decoders that selectively drive word lines of each of the plurality of mat rows;
   a row address latch block configured to generate a row address latch enable signal for driving the word lines, and a multi row address latch enable signal that groups the plurality of mat rows and the plurality of row decoders into a plurality of mat row blocks including a predetermined number of mat rows and a plurality of row decoder blocks including a predetermined number of row decoders, respectively; and
   a plurality of common control blocks corresponding to the plurality of row decoder blocks and configured to generate a mat block selection signal, which selects one of the mat row blocks, and a row decoder block selection signal, which selects one of the row decoder blocks, by using the multi row address latch enable signal.

9. The semiconductor memory device of claim 8, wherein the multi row address latch enable signal is generated prior to the row address latch enable signal.

10. The semiconductor memory device of claim 9, wherein the mat block selection signal is generated during an active period of the multi row address latch enable signal before the row address latch enable signal is activated.

11. The semiconductor memory device of claim 8, wherein the row address latch block comprises:
    a row address enable control unit for generating the row address latch enable signal in response to a bank active signal;
    a multi row mat selection driving unit for generating the multi row address latch enable signal in response to the bank active signal and the row address latch enable signal;
    a row address latch unit for receiving the row address latch enable signal and external address signals to generate address signals latched during an inactive period of the row address latch enable signal; and
    a row address decoding unit for receiving the latched address signals, the row address latch enable signal or the multi row address latch enable signal to generate row address decoding signals.

12. The semiconductor memory device of claim 11, wherein the row address enable control unit is configured to generate a row address enable signal having rising and falling timings delayed than rising and falling timings of the bank active signal.

13. The semiconductor memory device of claim 11, wherein the multi row mat selection driving unit includes:
    a delay for rising and falling timings of the row address latch enable signal; and
    a logic device for performing an OR operation of the bank active signal and an output signal of the delay.

14. The semiconductor memory device of claim 11, wherein the row address latch unit includes:
    a quad low decoder control unit for generating an inverted bank active signal and an inverted and delayed bank active signal in response to the bank active signal; and
    a sense amp enable control unit for generating a sense amp enable timing signal by using the bank active signal.

15. The semiconductor memory device of claim 11, wherein the row address decoding unit is configured to generate a first low address decoding signal group, which is associated with operations of all row decoders, through a combination of a part of the latched address signals and the row address latch enable signal, and a second low address decoding signal group, which is associated with operations of row decoder blocks, through a combination of a remaining part of the latched address signals and a quad row address latch enable signal, in which each row decoder block includes four row decoders.

16. The semiconductor memory device of claim 15, wherein the second low address decoding signal group includes:
   a first address decoding signal used for dividing the bank into an upper area and a lower area; and
   a second address decoding signal used for selecting one of the row decoder blocks.

17. The semiconductor memory device of claim 16, wherein the common control block includes:
   a multi mat selection unit configured to generate a signal that selects a mat row block and a row decoder block by using the second low address decoding signal group and fuse information regarding if a defective memory cell constituting the mat is replaced with a redundancy cell; and
   a multi row decoder control unit configured to generate a main word line enable signal in response to the generated signal.

18. The semiconductor memory device of claim 17, wherein the multi mat selection unit generates a mat selection signal based on an AND calculation result, in which the AND calculation result is obtained by performing an AND operation of a calculation result, which is obtained by performing an AND operation of the first and second address decoding signals constituting the second address decoding signal group, and the fuse information.

19. The semiconductor memory device of claim 17, wherein the multi mat selection unit is configured to generate the main word line enable signal in response to the mat selection signal and an inverted bank active signal.

20. The semiconductor memory device of claim 19, wherein the multi mat selection unit includes:
   a first circuit unit configured to generate a row decoder enable signal used for driving sub-word lines, which are connected to the main word line, in response to the inverted bank active signal; and
   a second circuit unit configured to generate a word line reset signal that controls activation of the word line by using the fuse information.

21. The semiconductor memory device of claim 20, wherein the row decoder includes:
   a unit for generating a signal (row decoder selection signal) that selects one of the row decoders constituting the row decoder block; and
   a normal word line buffer unit for generating a plurality of local address signals in response to the row decoder selection signal, the address decoding signals, the row decoder enable signal and the main word line enable signal;
   a main word line driving unit for generating a main word line driving signal in response to a part of the local address signals and the word line reset signal; and
   a 1:8 word line selection unit for generating a sub-word line driving signal in response to a remaining part of the local address signals and the word line reset signal.

22. The semiconductor memory device of claim 21, wherein the part of the local address signals is generated using a combination of the address decoding signal and the main word line enable signal, and the remaining part of the local address signals is generated using a combination of the address decoding signal and the row decoder enable signal.

23. The semiconductor memory device of claim 21, wherein the row decoder includes:
   a sense amp selection unit for generating a sense amp selection signal and an equalizing selection signal, which are provided to a specific mat row, in response to the second row address decoding signal group; and
   a sense amp control unit for generating a sense amp control signal by using the sense amp selection signal, the equalizing selection signal, and the sense amp enable timing signal, wherein the row decoder selection signal is generated by the sense amp selection unit.

24. The semiconductor memory device of claim 21, wherein the row decoder further includes a redundancy word line driving unit for driving a redundancy word line in response to the word line reset signal and the fuse information.

25. The semiconductor memory device of claim 8, wherein a number of the mat rows constituting the mat row block and a number of the row decoders constituting the row decoder block correspond to divisors of entire mat rows constituting the bank.

* * * * *